(12) United States Patent
Bachman et al.

(10) Patent No.: US 11,346,974 B2
(45) Date of Patent: May 31, 2022

(54) TECHNIQUES FOR NMR LOGGING WITH ANTENNA ARRAYS

(71) Applicant: Schlumberger Technology Corporation, Sugar Land, TX (US)

(72) Inventors: Henry Nathaniel Bachman, Sugar Land, TX (US); Albina Mutina, Sugar Land, TX (US)

(73) Assignee: SCHLUMBERGER TECHNOLOGY CORPORATION, Sugar Land, TX (US)

( * ) Notice: Subject to any disclaimer, the term of this patent is extended or adjusted under 35 U.S.C. 154(b) by 0 days.

(21) Appl. No.: 17/275,287

(22) PCT Filed: Sep. 11, 2019

(86) PCT No.: PCT/US2019/050537
§ 371 (c)(1),
(2) Date: Mar. 11, 2021

(87) PCT Pub. No.: WO2020/055957
PCT Pub. Date: Mar. 19, 2020

(65) Prior Publication Data
US 2022/0043177 A1      Feb. 10, 2022

Related U.S. Application Data

(60) Provisional application No. 62/730,406, filed on Sep. 12, 2018, provisional application No. 62/729,864, filed on Sep. 11, 2018.

(51) Int. Cl.
*G01V 3/32* (2006.01)
*G01N 24/08* (2006.01)
*G01V 3/34* (2006.01)

(52) U.S. Cl.
CPC ............. *G01V 3/32* (2013.01); *G01N 24/081* (2013.01); *G01V 3/34* (2013.01)

(58) Field of Classification Search
CPC ........... G01V 3/32; G01V 3/34; G01N 24/081
See application file for complete search history.

(56) References Cited

U.S. PATENT DOCUMENTS

| 4,710,713 A | 12/1987 | Strikman |
| 6,140,818 A | 10/2000 | Hurlimann |

(Continued)

FOREIGN PATENT DOCUMENTS

| CN | 201546719 U | 8/2010 |
| WO | 2011159294 A1 | 12/2011 |
| WO | 2018102362 A1 | 6/2018 |

OTHER PUBLICATIONS

International Preliminary Report on Patentability of International Patent Application No. PCT/US2019/050537 dated Mar. 9, 2021, 5 pages.

(Continued)

*Primary Examiner* — Gregory H Curran
(74) *Attorney, Agent, or Firm* — Trevor G. Grove

(57) ABSTRACT

The present disclosure relates to a method that includes generating a first pulse at a first position along a geological formation with a plurality of antennae, wherein the first pulse comprises a Can-Purcell-Meiboom-Gill (CPMG) sequence, and wherein each antenna of the plurality of antennae is configured to generate NMR data via transmitting and receiving pulses into the geological formation.

16 Claims, 11 Drawing Sheets

(56) References Cited

U.S. PATENT DOCUMENTS

| | | |
|---|---|---|
| 6,255,818 B1 | 7/2001 | Heaton et al. |
| 6,466,013 B1 | 10/2002 | Hawkes et al. |
| 6,838,875 B2 | 1/2005 | Freedman |
| 9,759,832 B1 | 9/2017 | Freedman et al. |
| 2002/0196017 A1* | 12/2002 | Akkurt ................. G01N 24/082 324/303 |
| 2004/0046552 A1* | 3/2004 | Taherian .............. G01N 24/081 324/303 |
| 2016/0033670 A1 | 2/2016 | Reiderman et al. |
| 2019/0277996 A1* | 9/2019 | Xiao ....................... G01V 3/32 |

OTHER PUBLICATIONS

Freedman, R., "Advances in NMR Logging," p. 60-66, Journal Petroleum Technology, SPE 89177, 2006.

International Search Report and Written Opinion issued in the related PCT application PCT/US2019/050537, dated Dec. 26, 2019 (9 pages).

Extended European Search Report issued in EP Application 19859129.9, dated Apr. 21, 2022, received on Apr. 14, 2022, (12 pages).

\* cited by examiner

TECHNIQUES FOR NMR LOGGING WITH ANTENNA ARRAYS

CROSS REFERENCE PARAGRAPH

This application claims the benefit of U.S. Provisional Application No. 62/729,864, entitled "TECHNIQUES FOR NMR LOGGING WITH ANTENNA ARRAYS," filed Sep. 11, 2018, and U.S. Provisional Application No. 62/730,406, entitled "TECHNIQUES FOR NMR LOGGING WITH ANTENNA ARRAYS," filed Sep. 12, 2018, the disclosure of which is hereby incorporated herein by reference.

BACKGROUND

This disclosure relates to techniques for NMR logging of downhole formations using downhole tools that include at least one antenna array.

This section is intended to introduce the reader to various aspects of art that may be related to various aspects of the present techniques, which are described and/or claimed below. This discussion is believed to be helpful in providing the reader with background information to facilitate a better understanding of the various aspects of the present disclosure. Accordingly, it should be understood that these statements are to be read in this light, and not as an admission of any kind.

Producing hydrocarbons from a wellbore drilled into a geological formation is a remarkably complex endeavor. In many cases, decisions involved in hydrocarbon exploration and production may be informed by measurements from downhole well-logging tools that are conveyed deep into the wellbore. The measurements may be used to infer properties or characteristics of the geological formation surrounding the wellbore.

One type of downhole well-logging tool uses nuclear magnetic resonance (NMR) to measure the response of nuclear spins in formation fluids to applied magnetic fields. Many NMR tools have a permanent magnet that produces a static magnetic field at a desired test location (e.g., where the fluid is located). The static magnetic field produces an equilibrium magnetization in the fluid that is aligned with a magnetization vector along the direction of the static magnetic field. A transmitter antenna produces a time-dependent radio frequency magnetic field that is perpendicular to the direction of the static field. The radio frequency magnetic field produces a torque on the magnetization vector that causes it to rotate about the axis of the applied radio frequency magnetic field. The rotation results in the magnetization vector developing a component perpendicular to the direction of the static magnetic field. This causes the magnetization vector to align with the component perpendicular to the direction of the static magnetic field, and to precess around the static field.

SUMMARY

A summary of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects that may not be set forth below.

In one embodiment, the present disclosure relates to a method that includes generating a first pulse at a first position along a geological formation with multiple antennae, wherein the first pulse comprises a Carr-Purcell-Meiboom-Gill (CPMG) sequence, and wherein each antenna of multiple antennae is configured to generate NMR data via transmitting and receiving pulses into the geological formation. Further, the method includes generating a second pulse at a second position with a first subset of the antenna of the multiple antennae, wherein the second pulse comprises CPMG and a first burst sequence. Further still, the method includes generating a third pulse at a third position with a second subset of antenna of the multiple antennae, wherein the first pulse comprises CPMG sequence and a second burst sequence. Even further, the method includes generating a suite of NMR data based at least in party on the first pulse, the second pulse, and the third pulse.

Various refinements of the features noted above may be undertaken in relation to various aspects of the present disclosure. Further features may also be incorporated in these various aspects as well. These refinements and additional features may be made individually or in any combination. For instance, various features discussed below in relation to one or more of the illustrated embodiments may be incorporated into any of the above-described aspects of the present disclosure alone or in any combination. The brief summary presented above is intended to familiarize the reader with certain aspects and contexts of embodiments of the present disclosure without limitation to the claimed subject matter.

BRIEF DESCRIPTION OF THE DRAWINGS

Various aspects of this disclosure may be better understood upon reading the following detailed description and upon reference to the drawings in which.

DETAILED DESCRIPTION

One or more specific embodiments of the present disclosure will be described below. These described embodiments are examples of the presently disclosed techniques. Additionally, in an effort to provide a concise description of these embodiments, certain features of an actual implementation may not be described in the specification. It should be appreciated that in the development of any such actual implementation, as in any engineering or design project, numerous implementation-specific decisions may be made to achieve the developers' specific goals, such as compliance with system-related and business-related constraints, which may vary from one implementation to another. Moreover, it should be appreciated that such a development effort might be complex and time consuming, but would still be a routine undertaking of design, fabrication, and manufacture for those of ordinary skill having the benefit of this disclosure.

When introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features.

As discussed herein, downhole logging techniques may employ multiple methods (e.g., gamma-ray spectroscopy, resistivity logging, NMR spectroscopy etc.) to characterize a downhole formation. Each of the methods are complementary and the combination of multiple methods may provide a more complete picture of the downhole formation. When all the methods collect data at a similar rate, characterization of a downhole formation is more efficient. One challenge in oilfield formation evaluation is the ability to log advanced NMR applications at rates closer to the rates of other logging methods.

Figure 1A:
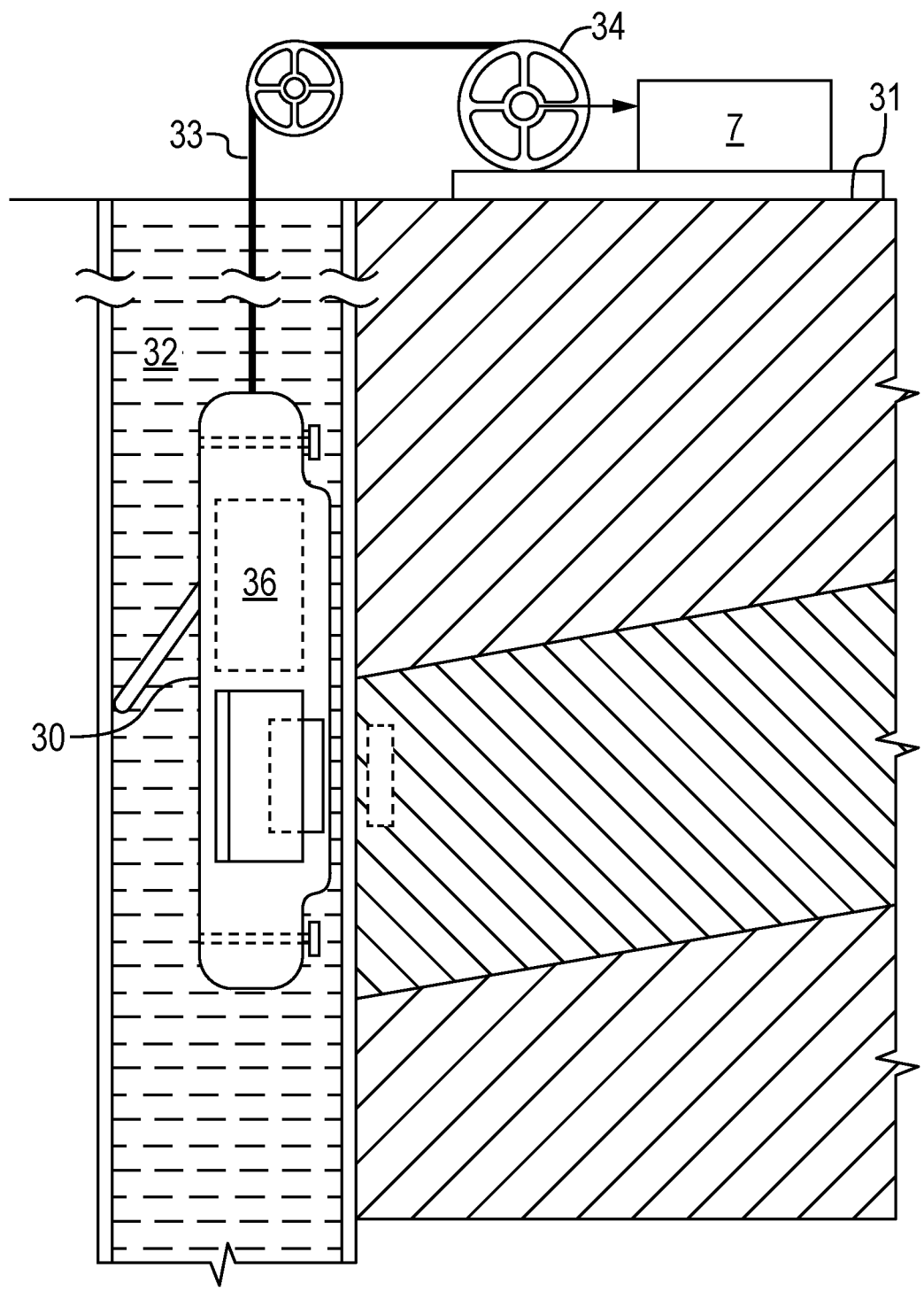
FIG. 1A shows an example wireline, slickline or coiled tubing conveyed NMR well logging instrument moving along the interior of a wellbore drilled through subsurface formations.

Certain techniques use downhole tools having an antenna array (U.S. Pat. No. 9,759,832B1), which is incorporated herein by reference in its entirety and for all purposes. FIG. 1A shows an example embodiment of an apparatus for investigating subsurface formations 31 penetrated by a wellbore 32, which can be used in performing various embodiments of a method according to the present disclosure. A well logging instrument 30 may be suspended in the borehole 32 on an armored electrical cable 33, the length of which substantially determines the relative depth of the well logging instrument 30. The cable 33 may be extended into the wellbore 32 and withdrawn therefrom by suitable means at the surface such as a drum and winch mechanism 34. It will be appreciated that other conveyance devices for moving the well logging instrument 30 such as slickline or coiled tubing may also use a winch mechanism as shown in FIG. 1A. Surface equipment, represented at 7, can be of any type know in the art for operation well logging instruments, and may include a processor subsystem, signal communication and recording devices and a telemetry transceiver for communicating with the well logging instrument 30.

The well logging instrument which makes the measurements can be any suitable NMR well logging device, for use in "wireline" conveyed well logging instrumentation as shown in FIG. 1A, or of a type that can be used in logging while drilling (LWD) applications to be explained below with reference to FIG. 1B. The well logging instrument 30 includes, for example, a magnet such as a permanent magnet, magnet array, electromagnet or combinations thereof for inducing a static magnetic field in the formations 31, and one or more radio frequency (RF) antennas for inducing a pulsed RF magnetic field in the formations 31 and for receiving RF energy induced by NMR phenomena excited in the formations 31.

The well logging instrument described above can also be implemented, for example, in logging-while-drilling ("LWD") equipment. As shown, for example, in FIG. 1B, a platform and derrick 210 are positioned over a wellbore 212 that may be formed in the Earth by rotary drilling. A drill string 214 may be suspended within the borehole and may include a drill bit 216 attached thereto and rotated by a rotary table 218 (energized by means not shown) which engages a kelly 220 at the upper end of the drill string 214. The drill string 214 is typically suspended from a hook 222 attached to a traveling block (not shown). The kelly 220 may be connected to the hook 222 through a rotary swivel 224 which permits rotation of the drill string 214 relative to the hook 222. In some embodiments, the drill string 214 and drill bit 216 may be rotated from the surface by a "top drive" type of drilling rig.

Drilling fluid or mud 226 is contained in a mud pit 228 adjacent to the derrick 210. A pump 230 pumps the drilling fluid 226 into the drill string 214 via a port in the swivel 224 to flow downward (as indicated by the flow arrow 232) through the center of the drill string 214. The drilling fluid exits the drill string via ports in the drill bit 216 and then circulates upward in the annular space between the outside of the drill string 214 and the wall of the wellbore 212, as indicated by the flow arrows 234. The drilling fluid 226 thereby lubricates the bit and carries formation cuttings to the surface of the earth. At the surface, the drilling fluid is returned to the mud pit 228 for recirculation. If desired, a directional drilling assembly (not shown) could also be employed.

A bottom hole assembly ("BHA") 236 may be mounted within the drill string 214, in some cases near the drill bit 216. The BHA 236 may include subassemblies for making measurements, processing and storing information and for communicating with the Earth's surface. Such measurements may correspond to those made using the NMR well logging instrument explained above with reference to FIG. 1A. The bottom hole assembly is typically located within several drill collar lengths of the drill bit 216. In the illustrated BHA 236, a stabilizer collar section 238 is shown disposed immediately above the drill bit 216, followed in the upward direction by a drill collar section 240, another stabilizer collar section 242 and another drill collar section 244. This arrangement of drill collar sections and stabilizer collar sections is illustrative only, and other arrangements of components in any implementation of the BHA 236 may be used. The need for or desirability of the stabilizer collars will depend on drilling conditions as well as on the demands of the measurement.

Figure 1B:
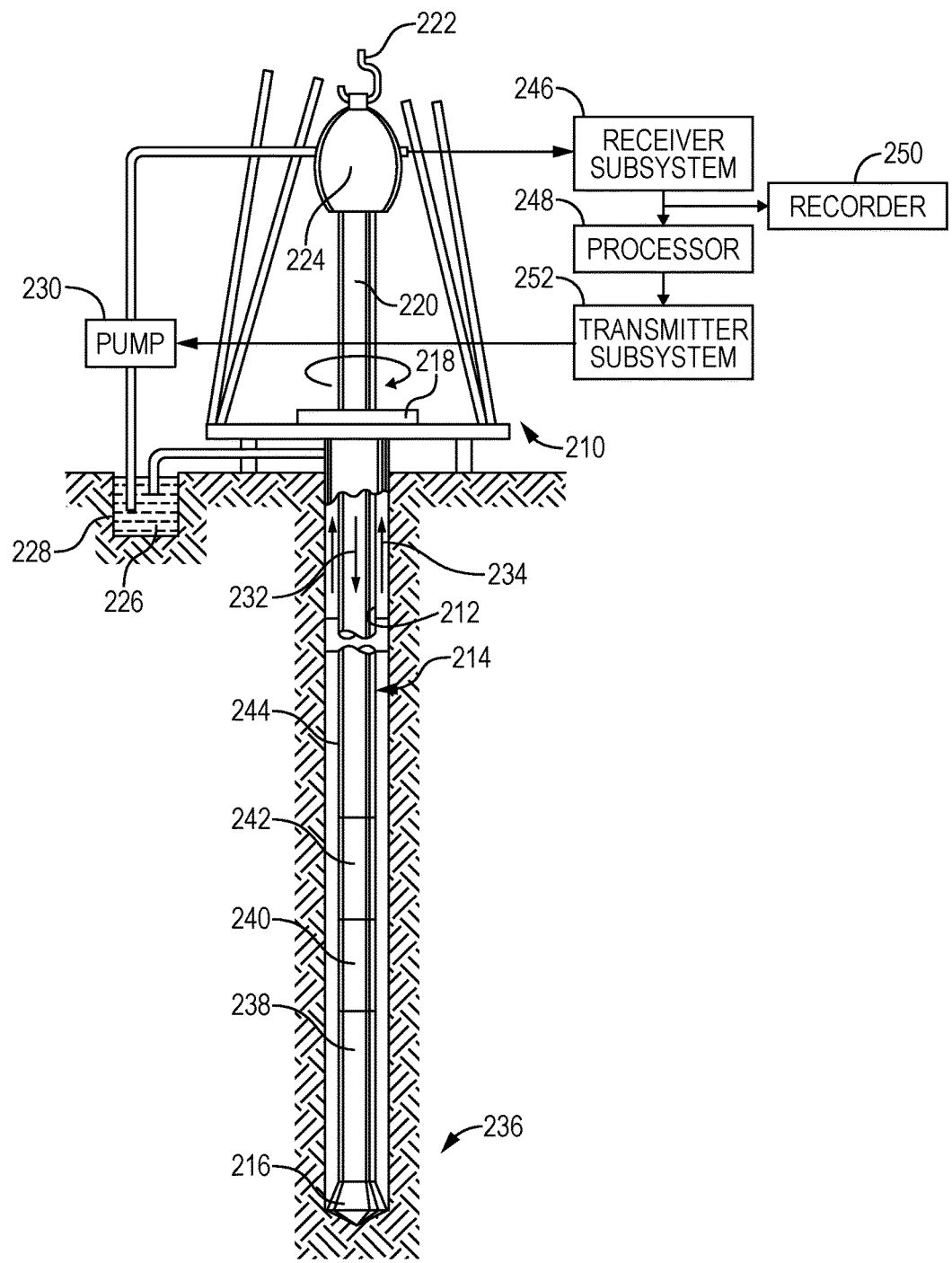
FIG. 1B shows an example logging while drilling (LWD) NMR logging instrument.

In the arrangement shown in FIG. 1B, the components of the NMR well logging instrument may be located, for example, in the drill collar section 240 above the stabilizer collar 238. Such components could, if desired, be located closer to or farther from the drill bit 216, such as, for example, in either stabilizer collar section 238 or 242 or the drill collar section 244.

The BHA 236 may also include a telemetry subassembly (not shown) for data and control communication with the Earth's surface. Such telemetry subassembly may be of any suitable type, e.g., a mud pulse (pressure or acoustic) telemetry system, wired drill pipe, etc., which receives output signals from LWD measuring instruments in the BHA 236 (including the NMR well logging instrument) and transmits encoded signals representative of such outputs to the surface where the signals are detected, decoded in a receiver subsystem 246, and applied to a processor 248 and/or a recorder 250. The processor 248 may comprise, for example, a suitably programmed general or special purpose processor. A surface transmitter subsystem 252 may also be provided for establishing downward communication with the bottom hole assembly.

The BHA 236 may also include conventional acquisition and processing electronics (not shown) comprising a microprocessor system (with associated memory, clock and timing circuitry, and interface circuitry) capable of timing the operation of the source and the data measuring sensors, storing data from the measuring sensors, processing the data and storing the results, and coupling any desired portion of the data to the telemetry components for transmission to the surface. The data may also be stored in the instrument and retrieved at the surface upon removal of the drill string. Power for the LWD instrumentation may be provided by battery or, as known in the art, by a turbine generator disposed in the BHA 236 and powered by the flow of drilling fluid. The LWD instrumentation may also include directional sensors (not shown separately) that make measurements of the geomagnetic orientation or geodetic orientation of the BHA 236 and the gravitational orientation of the BHA 236, both rotationally and axially.

The foregoing computations may be performed on a computer system such as one shown in the processor at 248 in FIG. 1B, or in the surface unit 7 in FIG. 1A. However, any computer or computers may be used to equal effect.

Figures 2A, 2B:
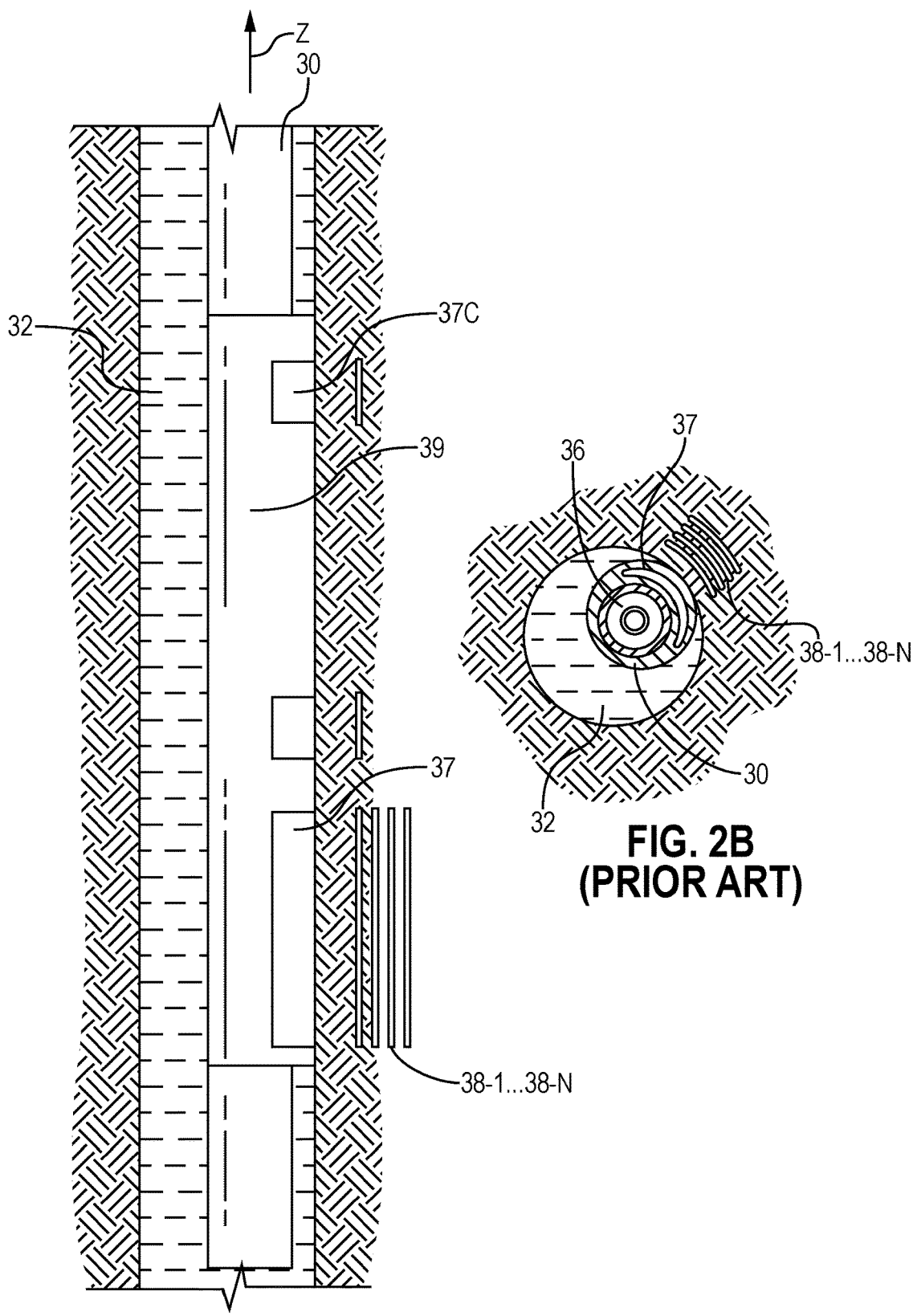
FIG. 2A shows a schematic representation of some components of an example embodiment of an NMR well logging instrument.
FIG. 2B shows a horizontal cross-section of the well logging instrument of FIG. 2A wherein different zones in the formation are shown that may be separately and individually excited to make NMR measurements therein.
Figure 2C:
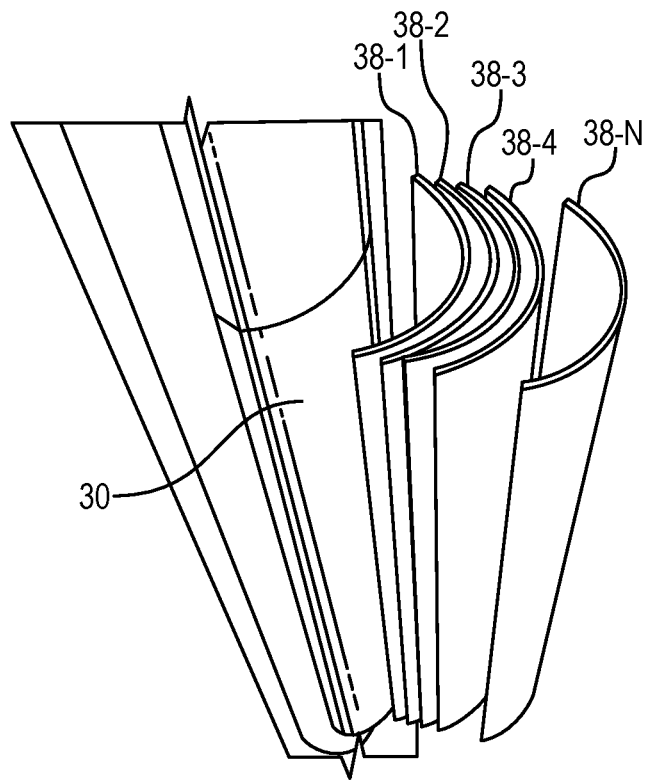
FIG. 2C shows an oblique view of the instrument of FIG. 2A to more clearly illustrate the different zones of FIGS. 2A and 2B.

The present example embodiment of NMR well logging instrument may be of a type that can be operated to obtain separate measurements from a plurality of closely spaced thin, cylindrical or other shape "shell"-like regions in the surrounding formations 31. A simplified representation of some of the components of a suitable type of well logging instrument is shown in FIGS. 2A, 2B and 2C. FIG. 2A shows a side view of the NMR well logging instrument 30. The example NMR well logging instrument shown in FIG. 2A may be one such as sold under the trademark MR SCANNER, which is a trademark of Schlumberger Technology Corporation, Sugar Land, Tex. A magnet or magnet array (magnet) is shown at 36. The magnet 36 may be a permanent magnet, magnet array, an electromagnet or any combination of the foregoing. An RF antenna, represented at 37, may be a suitably oriented wire coil or coils. The MR SCANNER instrument may include a separate RF antenna 37C, however this separate antenna is not important for purposes of explaining apparatus and methods according to the present disclosure.

FIG. 2A also illustrates a general representation of the type of closely spaced cylindrical thin shells, 38-1, 38-2, . . . 38-N, that can be selectively excited to produce NMR phenomena using a multi-frequency transmitter and receiver circuit. As is known in the art, for example as disclosed in U.S. Pat. No. 4,710,713 issued to Strickman, the well logging instrument may be programmed select the shell region to be investigated by appropriately selecting the frequency of the RF energy in the current pulses applied to the antenna 37. The magnet 36 may be arranged such that a static magnetic field induced in the formations (31 in FIG. 1) has substantially equal amplitude along the longitudinal dimension of the magnet 36, and in some embodiments, the amplitude of the static magnetic field may change with respect to lateral distance from the magnet 36. The RF antenna 37 may be arranged such that RF magnetic fields induced in the formations by passing pulses of RF current through the antenna 37 are substantially orthogonally polarized with reference to the polarization direction of the static magnetic field. The RF magnetic fields induced by the antenna 37 may also have substantially equal amplitude along the longitudinal dimension of the antenna 37 and the magnet 36. Similarly, the sensitivity distribution of the antenna 37 may be such that the antenna 37 has substantially equal sensitivity along the longitudinal dimension of the antenna 37. Longitudinal dimension as used in the present context is used to mean along a line parallel to the longitudinal axis of the well logging instrument 30, shown approximately by the arrow labeled Z in FIG. 2A.

The well logging instrument 30 may comprise circuitry for applying pulses of RF current through the antenna 37 and for detecting voltages induced in the antenna 37, of the well logging instrument 30. A non-limiting example embodiment of suitable circuitry is described in the Strickman '713 patent referred to above. The exact configuration of the circuitry is not intended to limit the scope of the present disclosure; those skilled in the art will be able to design different forms of suitable circuitry for use in the well logging instrument 30.

In a well logging instrument and method according to the present disclosure, the relative longitudinal dimensions of the antenna or antennas may be selected differently during the transmit phase compared to the receive phase, as will be further explained. An apparatus and method according to the present disclosure results in exciting NMR phenomena in the selected regions of the formations 31 and detecting signals resulting from such NMR phenomena only in longitudinal portions that are substantially unaffected by movement of the well logging instrument 30 along the wellbore 32. The different selected regions of the formations 31 are shown schematically in FIGS. 2A and 2B at 38-1 . . . 38-N. FIG. 2C shows an oblique view of the well logging instrument 30 to more clearly show the lateral separation within the formations 31 of the selected regions 38-1, 38-2, 38-3, 38-4, . . . 38-N.

1. Description of Speed Effects

There are two independent types of speed effects observed on NMR porosity and T2 distribution logs acquired at relatively fast logging speeds.

The first effect is caused by incomplete pre-polarization of the hydrogen nuclei by the static magnetic field induced by the magnet in the well logging instrument (e.g., as shown at 36 in FIG. 2A). Incomplete pre-polarization may result in underestimation of the total porosity; such effect is increased in formations which have substantial porosity with long longitudinal (T1) relaxation times of fluid filling the pore spaces. To measure accurate total porosities it is desirable that the susceptible nuclei being excited to induce NMR phenomena, e.g., hydrogen nuclei, be exposed to the static magnetic field for a sufficient time to obtain 95% (i.e., exposure times of at least 3 T1) or greater pre-polarization prior to the start of the NMR measurement. To obtain this level of pre-polarization while moving the well logging instrument at relatively high speeds, non-overlapping measurements are conducted. For non-overlapping measurements the hydrogen nuclei may be pre-polarized by a magnet that has sufficient length along the direction of motion to obtain full polarization. The pre-polarization magnet length depends on the desired maximum logging speed and the maximum T1 of the fluids in the formations to be polarized. The extent of pre-polarization that is actually obtained in any set of circumstances is related to the instrument speed and the maximum T1. The magnitude of the pre-polarization will be further explained below for different instrument designs, e.g., pre-polarization and antenna lengths. The term pre-polarization is used in present context to mean orientation of the nuclear spin axes of susceptible nuclei along the polarization direction of the static magnetic field induced by the magnet (36 in FIG. 2).

The second effect of logging speed is to compress the measured or apparent T2 distributions. Such compression of measured T2 distributions is greater for longer T2 times. Compression does not affect the apparent total NMR porosity; however, it leads to errors in calculated bound-fluid and free-fluid porosities. The compression effect results from longitudinal movement of the RF antenna during the NMR measurement away from the region of the formation where transverse magnetization was induced by imparting RF magnetic fields into the formation. The compression effect can be mitigated to some extent by using a larger RF antenna (larger being with reference to the direction of motion of the instrument during measurement); however, it remains a substantially adverse effect for practical antenna lengths and speeds of 1800 feet per hour. 1800 feet per hour is a practical instrument speed for other types of porosity measurements, e.g., gamma-gamma density porosity and neutron porosity.

Figure 3:
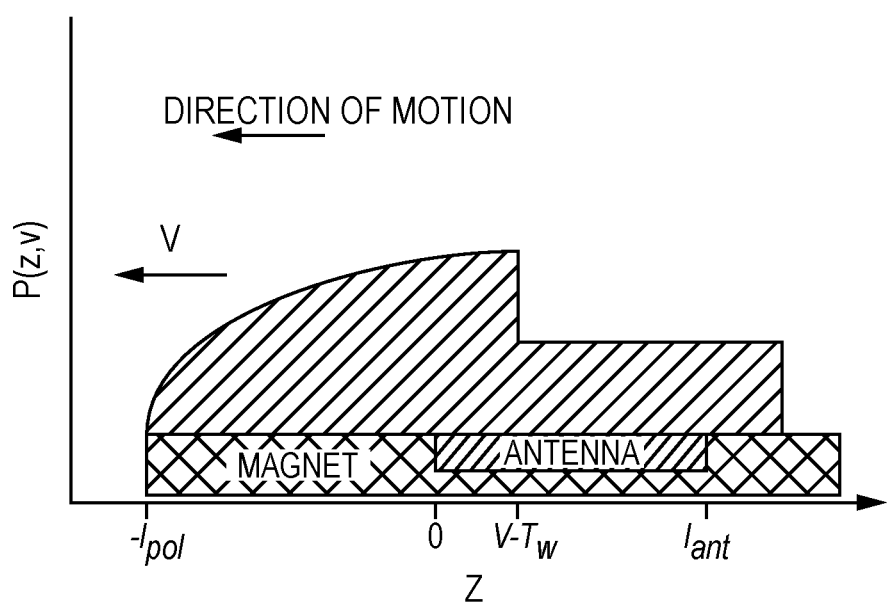
FIG. 3 shows a model of the polarization profile for an example embodiment of a well logging instrument moving at constant speed along a wellbore.

2. Speed Effects on NMR Polarization 2.1 Polarization Effects for an Instrument Moving in a Constant Amplitude (with Respect to Direction of Motion) Static Magnetic Field Below will be explained the average speed-dependent polarization over the length of the RF antenna. A schematic representation of a model NMR well logging instrument is shown in FIG. 3. The modeled instrument is moving at constant speed (v). On the y-axis is the speed and position dependent polarization profile shown over the length of the modeled instrument. In FIG. 3 it is assumed that the static magnetic field produced by the magnet is substantially constant amplitude with reference to the direction of motion (i.e., the longitudinal dimension) of the magnet. The polarization profile shown is for an instrument that has moved a distance v·Tw since the end of the previous measurement. The time Tw is the wait time between the end of one NMR measurement and the start of the next NMR measurement. A portion of the length v·Tw of the antenna in the direction of motion has been pre-polarized by the pre-polarization length lpol of the magnet whereas the remaining length of the antenna, lant v·Tw, has been re-polarized by the static magnetic field during the time Tw from the end of the previous NMR measurement. FIG. 3 shows a snapshot of the spin polarization in the formation at the instant before a new NMR measurement is initiated by application of a 90° RF pulse (explained further below) to the antenna.

The speed and position dependent polarization profile is given by the equations, $$P(z, v) = 1 - \exp\left(-\frac{T(z, v)}{T1}\right) \quad (1)$$

where $$T(z,v)=Tw, \text{ for } vTw \leq z \leq lant \quad (2a)$$

and $$T(z, v) = \frac{lpol + z}{v}, \text{ for } 0 \leq z \leq vTw. \quad (2b)$$

FIG. 3 and the above equations are valid for the general case of overlapping NMR measurements. In the region of the antenna in Eq. (2a) the instant NMR measurements overlap (i.e., two NMR measurements measure part of the same longitudinal interval) with the previous measurements whereas in the region in Eq. (2b) successive NMR measurements are non-overlapping. From Eq. (1) and the fact that T1 values in many formations are several seconds, wait times of 3T1 may be used to attain 95% polarization. Such long wait times would lead to very slow logging speeds. Therefore, using known apparatus and methods, measurements over the total length of the RF antenna are used for fast NMR logging without overlap. The condition for non-overlapping measurements is that v·Tw=lant. In the following description the notation may be simplified by replacing lant with la.

The average speed-dependent polarization over the length of the antenna may be determined by a weighted average of the speed and position dependent polarization function over the antenna such as by the following expression:

$$P(v) = \int_0^{l_a} S_a(z) P(z, v) dz = \int_0^{l_a} P(z, v) \frac{dz}{l_a}, \quad (3)$$

where in the integral on the right hand side of Eq. (3), to simplify the description, it is assumed that the antenna sensitivity function, Sa(z)=lant−1, is uniform along the longitudinal dimension of the antenna. Using Eqs. (1) and (2) the polarization may be determined by the expression:

$$P(v) = \qquad (4)$$
$$\frac{vT_w}{l_a} - \frac{vT_1}{l_a}\left(1 - \exp\left(-\frac{T_w}{T_1}\right)\right)\exp\left(-\frac{l_p}{vT_1}\right) + \left(1 - \exp\left(-\frac{T_w}{T_1}\right)\right)\frac{(l_a - vT_w)}{l_a}$$

The last term in Eq. (4) accounts for the overlapping part of the measurement where the hydrogen nuclei from the previous NMR measurement are repolarized by the static magnetic field during the wait time. It is desired to obtain non-overlapping measurements for relatively high instrument movement speeds for v·Tw=lant which may be represented by the expression:

$$P(v) = 1 - \frac{1}{r}(1 - \exp(-r))\exp\left(-\frac{l_p}{l_a}r\right), \qquad (5)$$

where the ratio r may be defined as:

$$r = \frac{T_w}{T_1} \equiv \frac{l_a}{vT_1}. \qquad (6)$$

It may be observed in Eq. (5) that the average polarization over the length of the antenna depends on the two dimensionless ratios, r and lp/la. Moreover, for a given well logging instrument configuration with fixed values for lp and la the average polarization depends only on the product, v·T1, i.e., the distance the instrument moves during the time T1. In subsurface formations there is a distribution of T1 times corresponding to different pores sizes and fluids. If a selected value of polarization, e.g., 95%, is obtained for a certain value of T1 then formations having shorter values of T1 will have polarization that exceeds 95%.

Figure 4:
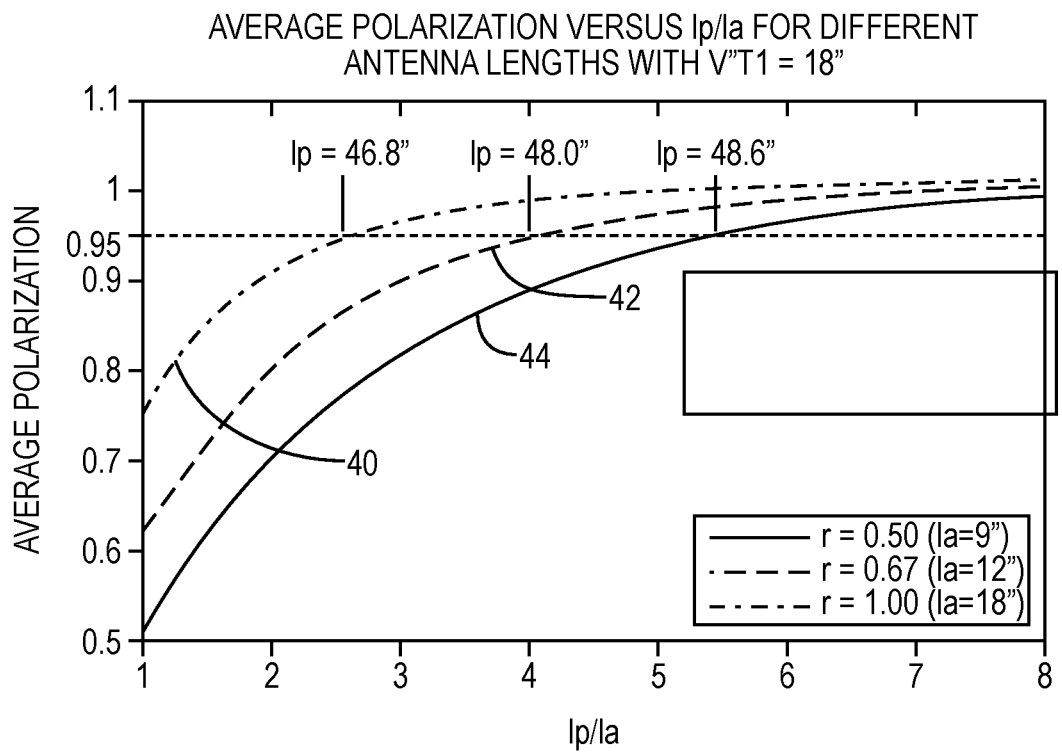
FIG. 4 shows plots of average polarization versus lp/la for different values of the parameter $r=la/v*T1$ for $v \cdot T1=18$ inches.

FIG. 4 shows plots of the average polarization given by Eq. (5) with respect to the ratio lp/la for values of the ratio r=1 at curve 40, r=0.67 at curve 42 and r=0.50 at curve 42 for a value of v·T1=18 inches. It is convenient for purposes of the present description to express v in inches per second and T1 in seconds. For a tool moving at 1800 feet per hour (6 inches per second) the plots in FIG. 4 are valid for a value of T1=3 seconds.

The three curves in FIG. 4 correspond to antenna lengths of 9, 12, and 18 inches. It may be observed that for all three antenna lengths a pre-polarization length of approximately 48 inches provides 95% pre-polarization. Note that less pre-polarization length is used for longer antenna lengths.

Some additional results for non-overlapping measurements computed from Eq. (5) are shown in Table 1.

TABLE 1

Average Polarization for Non-Overlapping Measurements
(v * Tw = la) v = 1800 feet per hour in a formation with
$T_1$ = 3 seconds v * $T_1$ = 18 inches

| lp (in.) | la (in.) | lp/la | r = la/v * $T_1$ | P(v) |
|---|---|---|---|---|
| 54 | 18 | 3 | 1 | 0.97 |
| 54 | 12 | 4.5 | 0.67 | 0.96 |
| 48 | 18 | 2.67 | 1 | 0.96 |
| 48 | 12 | 4 | 0.67 | 0.95 |
| 36 | 18 | 2 | 1 | 0.91 |
| 36 | 12 | 3 | 0.67 | 0.90 |

It may be observed in Table 1 that to obtain 95% or greater pre-polarization at 1800 feet per hour well logging instrument speed where T1=3 seconds would have a magnet pre-polarization length of 48 inches or greater.

Having explained the effect of instrument motion on polarization, methods and apparatus according to the present disclosure may now be better understood. It should be emphasized that Table 1 shows respective values for non-overlapping measurements (as defined above). Given the amount of time for acquiring NMR measurements, and given that NMR RF pulsing reduces some or all of the static field-induced magnetization in front (front being with respect to direction of motion) of the antenna (e.g., 37 in FIG. 2A), the only way for known NMR apparatus to make non-overlapping measurements is to stop applying RF current pulses to the antenna and wait for the instrument to move one sensor length (i.e., the length of the antenna). In practice, skipping such a large axial portion of formation is not desirable, and thus a compromise is made to allow for an "overlapped" region of the formation in combination with the non-overlapped part of the measurement. The overlapped region may take a substantial amount of wait time to re-polarize the nuclear spins, which in turn slows down logging. This limitation is one of the bases for apparatus and methods according to the present disclosure.

3. Instrument Speed Effects on T2

The effect of well logging instrument speed on NMR spin-echo amplitude decay is to increase the apparent spin echo amplitude decay rate. This means that the apparent or observed T2 values are reduced compared to the true values that would be measured by a stationary tool. The T2 speed effect can be better understood by considering FIG. 5, which shows two positions of the RF antenna at times separated by dt as the tool moves in the direction shown at a constant speed, v.

Figure 5:
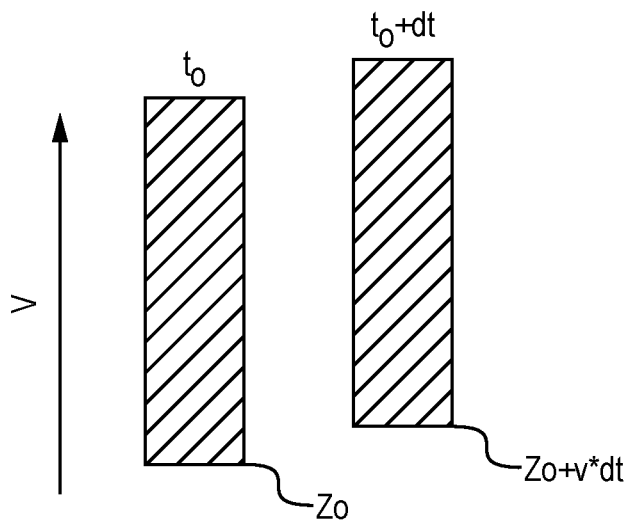
FIG. 5 shows two positions of a prior art NMR tool RF antenna for an instrument moving with speed v.

At time to in FIG. 5, a radio frequency current pulse is passed through the first RF antenna (see, e.g., 37 in FIG. 2A) having duration and amplitude selected to reorient the nuclei by 90° (the NMR excitation pulse) and thus creates a transverse magnetization in the formation adjacent to the antenna, wherein transverse is with reference to the direction of the static magnetic field induced by the magnet (36 in FIG. 2A). At time to+dt the antenna has moved a distance v*dt away from the volume where the transverse magnetization was induced by the RF magnetic field at time to. To measure spin echo amplitude decay, the 90° RF current pulse may be followed by a plurality of RF current pulses passed through the antenna, wherein each such pulse has a duration and amplitude selected to reorient the nuclear magnetic spin axes of the susceptible nuclei by 180° each such current pulse separated by a spin echo time TE. RF signals generated by NMR spin echoes following the 180° RF pulses are detected and their amplitudes represent the spin echo amplitude decay rate. Motion of the instrument during the time span of the 180° RF pulses that follow the 90° excitation pulse is the cause of the T2 speed effect.

During the acquisition of the spin-echoes, which can take one second or more, the instrument moves into a region that has no transverse magnetization and therefore as subsequent spin echoes are acquired the spin echo signal is reduced by the loss of transverse magnetization. FIG. 5 shows the instrument positions at times to and to+dt. If the transverse magnetization created at time to corresponds to the length of the instrument shown in FIG. 5, it is apparent that when the instrument is moved to a new position at time to+dt as shown, the antenna will be at least in part positioned adjacent an area of the formation for which no transverse magnetization has occurred. Such position-related loss of transverse magnetization, and therefore signal amplitude for this simple model shown in FIG. 5 may be expressed as:

$$dM = -\frac{vdt}{l_a}M \quad (11)$$

and by integration the transverse magnetization at time t may be determined by the expression:

$$M(t) = M(t_0)\exp\left(-\frac{v(t-t_0)}{l_a}\right) \quad (12)$$

Eq. (12) indicates that the speed-affected T2 related spin echo amplitude decay time is given by T2v=la/v and that during well logging the apparent or measured decay rate may be expressed as:

$$\frac{1}{T_{2a}} = \frac{1}{T_2} + \frac{1}{T_{2v}} \equiv \frac{1}{T_2} + \frac{v}{l_a} \quad (13)$$

The T2 related spin echo amplitude decay speed effect can be mitigated somewhat by using a longer RF antenna, however, it is still a substantial effect and represents an obstacle to accurate fast NMR well logging. Using Eq. (13) the apparent T2 relaxation time (and/or values of such times used to calculate a T2 distribution) may be represented as:

$$T_{2a} = \frac{T_2 \cdot T_{2v}}{T_2 + T_{2v}}, \quad (14)$$

Eq. (14) shows that the apparent relaxation time is less than the lesser of T2 and T2v. Table 2 shows the speed effect at 1800 feet per hour instrument speed (6 inches per second) for different antenna lengths. It may be observed in Table 2 that for longer values of T2 the apparent values, T2a, are substantially smaller than their actual values.

TABLE 2

T2 Speed Effect at 1800 feet per hour

| la (in.) | T2(s) | T2a(s) |
|---|---|---|
| 6 | 1 | 0.5 |
| 6 | 3 | 0.75 |
| 12 | 1 | 0.67 |
| 12 | 3 | 1.2 |
| 15 | 0.5 | 0.42 |
| 15 | 1 | 0.71 |
| 15 | 2 | 1.1 |
| 15 | 3 | 1.4 |
| 18 | 0.5 | 0.43 |
| 18 | 1.0 | 0.75 |
| 18 | 2.0 | 1.2 |
| 18 | 3.0 | 1.5 |

4. Novel RF Antenna Design and Associated Pulse Sequences for Fast NMR Logging without T2 Speed Effects A pre-polarization magnet with a flat (defined above) magnetic field profile and a length chosen to be in the range from 48 to 54 inches, depending on the RF antenna length and other requirements, was shown above to be suitable for fast NMR logging (e.g., at speeds up to 1800 feet per hour).

The T2 speed effect, however, would use a different antenna design to enable fast logging. In NMR well logging instrument designs known in the art prior to the present disclosure the same RF antenna length which is used to transmit RF pulses is also used to receive the NMR signals from the sensitive volume (the measurement region in FIG. 2) of the formation. There may be multiple RF antennas in conventional NMR tools (see, e.g., Freedman, R., "Advances in NMR Logging," p. 60-66, Journal Petroleum Technology, SPE 89177, 2006), however, the total length of the antenna in known multiple antenna instruments is used both to transmit RF pulses, and also to receive NMR signals from the formation (see 38-1, 38-2, 38-3 and 38-4 in FIG. 2B). During NMR well logging measurement when the well logging instrument is moving along a wellbore, the antenna moves away from the region where transverse magnetization was excited by the transmitted RF pulses and, as explained above, such movement causes the T2 speed effect as explained with reference to FIG. 5.

Figure 6:
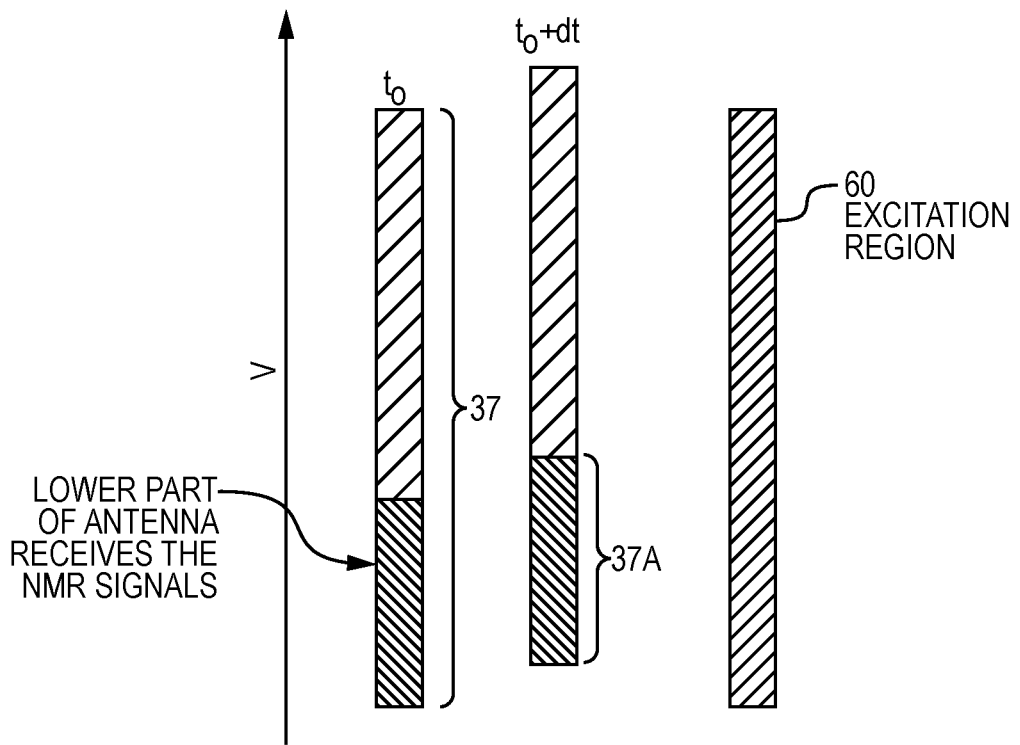
FIG. 6 shows two positions of an RF NMR antenna with the design disclosed herein for a tool moving with speed v. At time to a 90° excitation pulse applied to the antenna creates a transverse magnetization in the formation adjacent to the antenna shown as the "excitation region" As the tool moves during time to+dt the lower part of the antenna receives signal from formation which is consistently within the excitation region, so as the tool moves, there is no loss of transverse magnetization to cause the T2 speed effect.
Figure 6A:
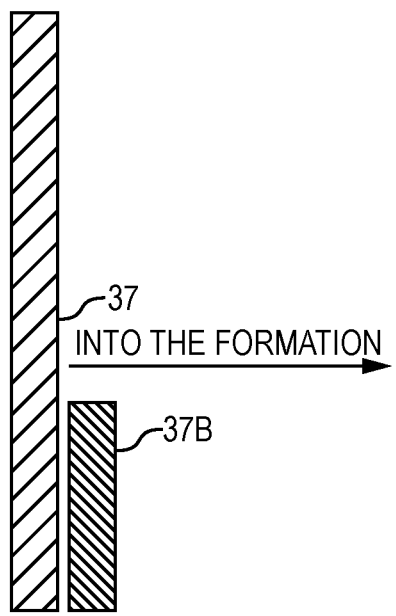
FIG. 6A shows a schematic view of an embodiment of an NMR well logging instrument having separate transmitter and receiver antennas.

As shown schematically in FIG. 6 and FIG. 6A, or single or multiple antennas may overcome spin echo signal amplitude reduction caused by the loss of transverse magnetization as a result of instrument motion. In FIG. 6 the schematic can be interpreted either as a single antenna with different portions, or two separate antennas which are juxtaposed end-to-end and simultaneously excited during transmit, while only the lower antenna is active during receive. FIG. 6A is an example of separate antennas juxtaposed side by side. In transmit mode the entire length 37 in FIG. 6, or the longer antenna as shown at 37B in FIG. 6A, may be used to transmit RF pulses, whereas in receive mode only the lower part of the antenna, i.e., the receiver section shown at 37A of FIG. 6, or the shorter antenna 37B of FIG. 6A is connected to receiver circuitry in the instrument, e.g., as shown at 39 in FIG. 2A, to detect NMR signals from the measurement region. Because the receiver section 37A of the antenna 37 in FIG. 6 (or a similar length separate antenna as shown at 37B in FIG. 6A) remains opposite and within the excited region 60 as the instrument moves there is no speed induced T2 decay resulting from loss of transverse magnetization.

In the embodiment shown in FIG. 6 the receiver section 37A of the antenna 37 is active in receive mode while the remaining (upper) part of the antenna may be electrically shorted out, for example, during NMR signal acquisition. Several switching technologies can be used for shorting a portion of the antenna. While the switching times of reed relays and even solid state relays are, at best, on the order of 100's of microseconds, MOSFET switches feature turn-on times on the order of 100's nanoseconds. The ON resistance of the switch (Rds) can now be as low as 15 milliohms for a 650V rated MOSFET. This development opens up the possibility of using MOSFET switches inside the very sensitive NMR antenna circuit. It is to be clearly understood that the scope of the present disclosure is not limited to the embodiment shown in FIG. 6 and that in other embodiments two separate juxtaposed antennas may be used as shown at 37 and 37B in FIG. 6A, wherein the two antennas are in the same orientation or in different orientations. It should also be clearly understood that using the lower part of the antenna (e.g., receiver section 37A in FIG. 6) is appropriate for the case where the direction of motion of the NMR well logging instrument is toward the surface of the wellbore (up logging), i.e., toward shallower measured depth. In the case of moving the NMR well logging instrument away from the surface (down logging) the upper part of the antenna is appropriate. In the case of logging while drilling (LWD)

instruments, wherein measurements may be made as the instrument moves in either the direction of shallower or greater measured depth, the receiver section of the antenna or a separate receiver antenna may be positioned substantially in the middle along the antenna or separate transmitter antenna.

Figure 6B:
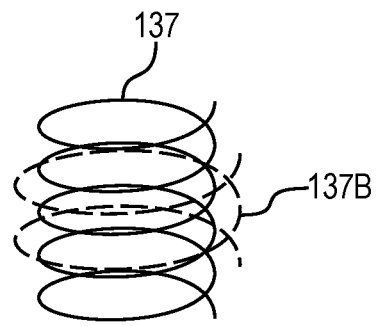
FIG. 6B shows a schematic view of an embodiment of NMR well logging instrument having separate transmitter and receiver antennas which are axially-concentric.

The NMR well logging instrument disclosed herein can be used with any conveyance methods, including without limitation armored electrical cable ("wireline"), on or in a well drilling assembly, (LWD), coiled tubing, downhole tractors, or slick line. For wireline NMR logging instruments, the T2 speed effect (among other factors) limits the logging speed to be much slower than some other formation evaluation tools which can be logged at 1800 feet per hour or more. Using an instrument according to the present disclosure, NMR logging speeds can be increased and thus save rig time. For LWD NMR instruments, the logging speeds are considerably slower than for wireline conveyed instruments, but speed effects still exist. Specifically, the sensitive region is sometimes axi-symmetric and short. The extent of the parasitic T2 speed effect depends on the rate of penetration of the drill bit and bottom hole assembly (BHA). Given the short sensitive region of LWD NMR well logging instruments, rates of penetration in excess of 100 feet per hour may show a T2 speed effect which is unacceptably large. Similar arguments apply to logging while tripping or measurement after drilling. The antennas used in LWD NMR logging tools are typically of a circular coil design to achieve azimuthal symmetry. An example implementation of an NMR well logging instrument according to the present disclosure is that the transmitter coil and the receiver coils can be concentrically aligned as shown at 137 and 137B in FIG. 6B. Without departing from the scope of the present disclosure, the transmitter coil would be longer while the receiver coil would be shorter, spanning only a fraction of the length of transmitter coil.

Figure 7:
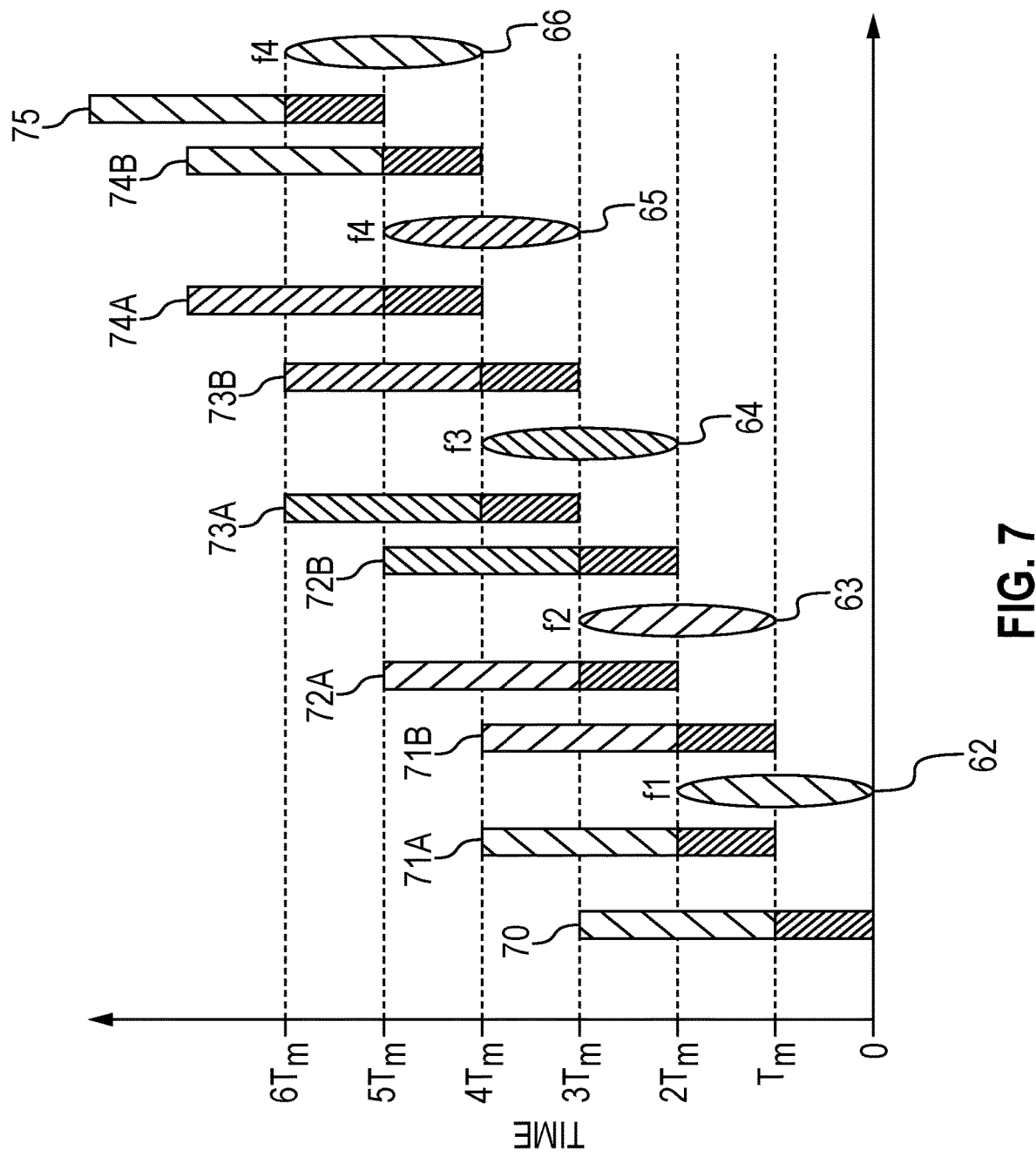
FIG. 7 shows an example of a multi-frequency NMR logging apparatus and associated pulse sequences for acquisition of NMR logging data without speed effects on the measured T2 distributions caused by loss of transverse magnetization as the tool moves.

Consider a logging instrument moving with a constant speed v. FIG. 7 shows an example of how to use the antenna design as explained above with reference to FIG. 6, and an associated multi-frequency RF pulse sequence for fast NMR logging. In this example embodiment the receiver section (37A in FIG. 6) of the RF antenna is one third of the total length of the RF antenna (37 in FIG. 6). The measurement time Tm is equal to the time used to acquire some or all of the NMR measurements, e.g., spin-echo amplitude measurements in a pulse sequence (or sequences) for estimating NMR properties of the formations. The pulse sequence entails applying a plurality of radio frequency current pulses and receiving the signals generated therein. During each Tm the well logging instrument moves a distance v*Tm which is chosen to be equal to the length of the receiver section (37A in FIG. 6) of the antenna. The vertical axis in FIG. 7 is the time axis and each scale increment is equal to one measurement time Tm. For purposes of the present disclosure, a measurement cycle may be defined as all the NMR RF current pulses and measurements made during Tm. FIG. 7 shows different positions of the instrument as it moves through different measurement cycles. Each measurement cycle is labelled with a different frequency (f1 through f4) each of which corresponds to a different radial depth or shell (as originally shown with 38-1 through 38-4 in FIG. 2B) in the formation for a multi-frequency well logging instrument having a magnet (36 in FIG. 2B) which has a magnetic field with an amplitude variation with respect to lateral distance from the magnet, but with substantially constant amplitude over a selected pre-polarization length thereof. Different frequencies may be selected such that the respective measurement regions 62-66 are closely spaced in the radial direction as long as the radial spacing between adjacent excited and measurement regions is sufficiently large so that RF pulses emitted at one frequency do not disturb the static magnetization in regions corresponding to any of the other frequencies. Such result may be obtained by using shaped RF pulses (e.g., and without limitation to limit the effective RF bandwidth) Pulse shaping is a standard NMR technique that includes adjusting the amplitude and phase of the RF pulses at a given frequency to ensure they do not degrade magnetization in regions to be sampled by RF pulses at other frequencies.

In the present example embodiment shown in FIG. 7 the lower third of the RF antenna is used to receive the spin-echo signals whereas the entire antenna is used to transmit 90° and 180° RF pulses. During well logging, measurements are repeated using four, closely spaced measurement regions 62-66 and vTm=la/3 where Tm is the measurement time, v represents the instrument speed, and la represents the antenna length. The positions of the instrument at the beginning and at the end of each measurement cycle (e.g., for any individual set of RF pulses and signal detection sequence) are indicated at 70, 71A, 71B, 72A, 72B, 73A, 73B, 74A, 74B, and 75, where the end of one measurement and the beginning of the subsequent measurement may be made at the same instrument position (e.g., 71A, 71B, 72A, 72B, 73A, 73B, 74A, and 74B) by starting the subsequent measurement using a different frequency for the RF pulses than the previous measurement. Using the foregoing technique the excitation and measurement regions in the subsequent measurement cycle are substantially unaffected by RF pulse transmission from the prior measurement. In the foregoing discussion, for cases when the antenna sensitive region is different from the physical antenna length, the antenna sensitive region is considered to be the excitation region.

It may be useful to explain in more detail the tool motion and measurements shown in FIG. 7. The measurement starts at the extreme left of FIG. 7 at longitudinal position 70 with a measurement made at a first frequency f1 and thus in a measurement region 62 during receiving RF signals induced by NMR phenomena. During the measurement time Tm the instrument moves from position 70 to the position 71A. The position of 71A is located at a longitudinal distance from the first position 70 equal to v·Tm. The measurement region 62 annotated with f1 indicates the formation region from which the received spin-echo signals were acquired during the first measurement. At the end of the first measurement the frequency of the transmitter is rapidly changed to f2 and a new measurement starts on the second measurement region 63, but with the instrument still substantially at the same axial position as 71A, now indicated by 71B. The slight axial movement between 71A and 71B is the result of a frequency switching time which is short and is negligible compared to Tm. The measurement region 63 annotated with f2 shows the formation region from which the received spin-echo signals were acquired during the second measurement. Similarly, at the end of the second measurement, with the instrument at a third axial position 72A the transmitter frequency is rapidly switched to a third frequency f3 and a new measurement starts on the third measurement region 64 with the instrument still at the third axial position 72B. It may be observed in FIG. 7, that using an effective receiver antenna length of vTm=la/3, at the end of the third measurement the lower part of the antenna overlaps part of the axial region measured during the first measurement. Therefore another measurement may be made on a fourth measurement region (e.g., at 65) before a new measurement made with fully pre-polarized nuclei can be made once again in the first frequency shell (shown as measurement region 66). Thus at the end of the third measurement the frequency of the transmitter is rapidly changed to f4 and a new measurement starts on the fourth frequency shell, e.g., in measurement region 65). At the end of the fourth measurement, the transmitter frequency may be rapidly switched back to f1 and the process repeats until an entire axial region of interest has been measured. As may be inferred from FIG. 7, the fractional length of the receiver portion (37A in FIG. 6) of the antenna, or separate receiver antenna (37B in FIG. 6A), may be a fraction of the length of the antenna, which in turn is related to the speed of motion of the well logging instrument and the number of different RF frequencies desired to excite different regions of the formation, that is:

$$vT_m = l_a/x \qquad (15)$$

where x may be at least 2 (in embodiments where only integer values are used, however it should be noted that non-integral values can be used as well) to eliminate both the T1 and T2 speed effects, and additionally the desired number of RF frequencies may be at least x+1, that is, the minimum choice of frequencies is 3. However, the relationship 15 is not limited only to integer values nor that the measurement region and vTm are equal. For example, the measurement region may be ⅓ of la while the distance traveled in one measurement cycle vTm is ⅔ of la. Further, a different number frequencies may be chosen according to a desired pulsing scheme, a desired change in vertical resolution, or a petrophysical consideration for measuring multiple depths into the formation. The scope of the present disclosure is not limited by such considerations.

A few observations and comments using the multi-frequency NMR measurements shown in FIG. 7 are instructive. Successive measurements are adjacent in the axial direction so there are no missed axial zones of the formation. There is no delay between successive measurements apart from the time for switching frequencies (which is negligible compared to typical NMR wait times between measurements) so that the duty cycle of the transmitter will be higher than that used in NMR well logging instruments known in the art. Each of the measurements shown in FIG. 7 may be from within a sensitive volume that is fully pre-polarized by a magnet as described above. The rapid switching of transmitter frequencies may be performed using well known solid state switches. The example shown in FIG. 7 is for the case where the length of the receiver section of the antenna is one third of the total antenna length, e.g., v·Tm=la/3 which uses four frequencies to obtain a properly polarized suite of axially continuous measurements. In general, if v·Tm=la/n where n=2, 3, . . . then n+1 frequencies or more may be used to obtain an properly polarized suite of axially continuous measurements. The order of frequencies does not necessarily have to be monotonically increasing or decreasing. In embodiments, the measurement region does not move substantially beyond the initial excitation region for a particular transmitter antenna length 37. It is possible that some combination of the distance vTm, the excitation region, and the measurement region will result in some or all of the receiver section moving beyond the initial excitation region, and thus T2 speed effects will occur. Unintended variable speeds are one cause of such cases. The present disclosure applies to any measurement method known to those skilled in the art which involves a preparation pulse or set of pulses (for example the 90 degree and 180 degrees pulses) applied to the transmitter length, and measurement events (for example the receiving of the echo signals) in the measurement region. Examples include saturation recovery sequences, inversion recovery sequences, composite pulse sequences, relaxometry sequences, and alike. A specific case is discussed next.

Consider a specific example of the antenna and RF pulse sequence shown in FIG. 7 for a well logging instrument moving at a speed of 6 inches per second (1800 feet per hour). If the receiver section (37A in FIG. 6A) of the RF antenna has a length of 6 inches then the antenna length may be 18 inches and the measurement time Tm=1 second. During the measurement time a pulse sequence, e.g., a Carr-Purcell-Meiboom-Gill (CPMG) pulse sequence with 5000 spin echoes (caused by 5000 180° RF pulses following an initial 90° RF excitation pulse) may be acquired using an echo spacing TE of 0.2×10 1 s. In some embodiments, a set of CPMG sequences can be operated after the first main CPMG sequence having fewer spin echoes and a plurality of, e.g., 10 short wait time (e.g., 0.02 s) measurement sequences each having a relatively small number of spin echoes (e.g., 20). These sets of CPMG sequences are sometimes referred to as bursts or trainlets, and the present disclosure includes potentially choosing the measurement cycle to include these bursts and any other plurality of pulses. If a longer measurement time is desired in some embodiments the receiver section of the antenna may be a larger fraction of the total length of the antenna, e.g., one-half of the total antenna length, v·Tm=la/2 which increases the measurement time to 1.5 seconds for an 18 inch antenna and an instrument speed of 6 inches per second. Using such longer receiver antenna (or receiver section of the transmit/receive antenna as explained above) would use three different RF frequencies as discussed above. Other embodiments may comprise a longer or shorter total antenna length. Other embodiments of antenna design and measurement sequences may be used that are within the scope of the present disclosure.

NMR spin-echo well logging measurements are typically acquired as phase alternated pairs (i.e., the phases of the 90° pulses in two phase alternated pair CPMG sequences are shifted by a phase angle of 180° and they are then subtracted from each other) in order to cancel baseline offsets in the CPMG spin echo signals. For the measurements shown schematically in FIG. 7 subsequent measurements at the same frequency may be one antenna length apart and could be acquired as phase alternated pairs, or measurements at the different closely spaced frequencies could be acquired with alternating phases and combined. In some embodiments, the offsets could be accounted for in the data processing (See, Freedman, U.S. Pat. No. 6,838,875). The method for removing the offsets is not intended to limit the scope of the present disclosure.

Certain advanced logging modes on tools, across both wireline and LWD, may log at or below 100 fph (feet per hour) on LWD, and at or below 600 fph on wireline. In many cases, it may be useful to perform faster logging, such as 1800 fph or more. Accordingly, the techniques of the present disclosure are direct to improving the acquisition rate of NMR logging tools, such as those with multiple antennae (e.g., coils). The present techniques employ transmit and receive control of each of the antenna in an antenna array to solve two problems: 1) prepolarization of the magnets on the NMR tool can be used to fullest effect, and 2) to acquire different patterns of NMR data on each coil to build up an entire suite of data all at one depth location, thus enabling truly fast logging.

Figure 8:
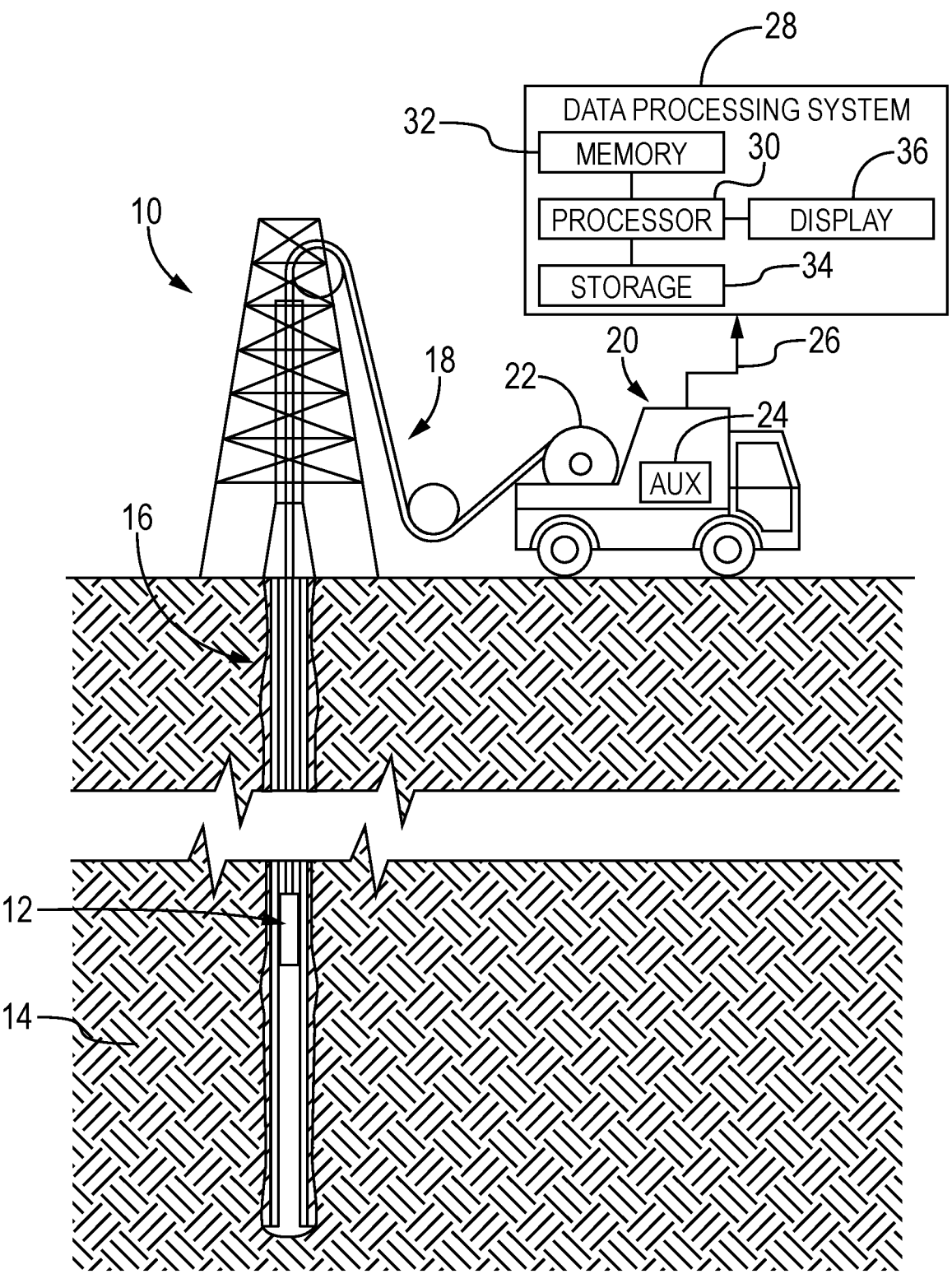
FIG. 8 is a schematic diagram of a well-logging system that may obtain induction measurements that may be used to identify formation resistivity and dielectric constant, in accordance with an embodiment.

With this in mind, FIG. 8 illustrates a well-logging system 10 that may employ the systems and methods of this disclosure. The well-logging system 10 may be used to convey a downhole tool 12 through a geological formation 14 via a wellbore 16. The downhole tool 12 may be conveyed on a cable 18 via a logging winch system 20. Although the logging winch system 20 is schematically shown in FIG. 8 as a mobile logging winch system carried by a truck, the logging winch system 20 may be substantially fixed (e.g., a long-term installation that is substantially permanent or modular). Any suitable cable 18 for well logging may be used. The cable 18 may be spooled and unspooled on a drum 22 and an auxiliary power source 24 may provide energy to the logging winch system 20 and/or the downhole tool 12.

Moreover, although the downhole tool 12 is described as a wireline downhole tool, it should be appreciated that any suitable conveyance may be used. For example, the downhole tool 12 may instead be conveyed as a logging-while-drilling (LWD) tool as part of a bottom hole assembly (BHA) of a drill string, conveyed on a slickline or via coiled tubing, and so forth. For the purposes of this disclosure, the downhole tool 12 may be any suitable measurement tool that obtains NMR logging measurements through depths of the wellbore 16.

Many types of downhole tools 12 may obtain induction logging measurements in the wellbore 16. These include, for example, the Rt Scanner, AIT, and Thrubit Induction tools by Schlumberger Technology Corporation, but induction logging measurements from other downhole tools by other manufacturers may also be used. The downhole tool 12 may provide induction logging measurements 26 to a data processing system 28 via any suitable telemetry (e.g., via electrical signals pulsed through the geological formation 14 or via mud pulse telemetry). The data processing system 28 may process the induction logging measurements 26 to identify a conductivity and/or resistivity and dielectric constant at various depths of the geological formation 14 in the wellbore 16.

To this end, the data processing system 28 thus may be any electronic data processing system that can be used to carry out the systems and methods of this disclosure. For example, the data processing system 28 may include a processor 30, which may execute instructions stored in memory 32 and/or storage 34. As such, the memory 32 and/or the storage 34 of the data processing system 28 may be any suitable article of manufacture that can store the instructions. The memory 32 and/or the storage 34 may be ROM memory, random-access memory (RAM), flash memory, an optical storage medium, or a hard disk drive, to name a few examples. A display 36, which may be any suitable electronic display, may provide a visualization, a well log, or other indication of properties in the geological formation 14 or the wellbore 16 using the induction logging measurements 26.

Figure 9:
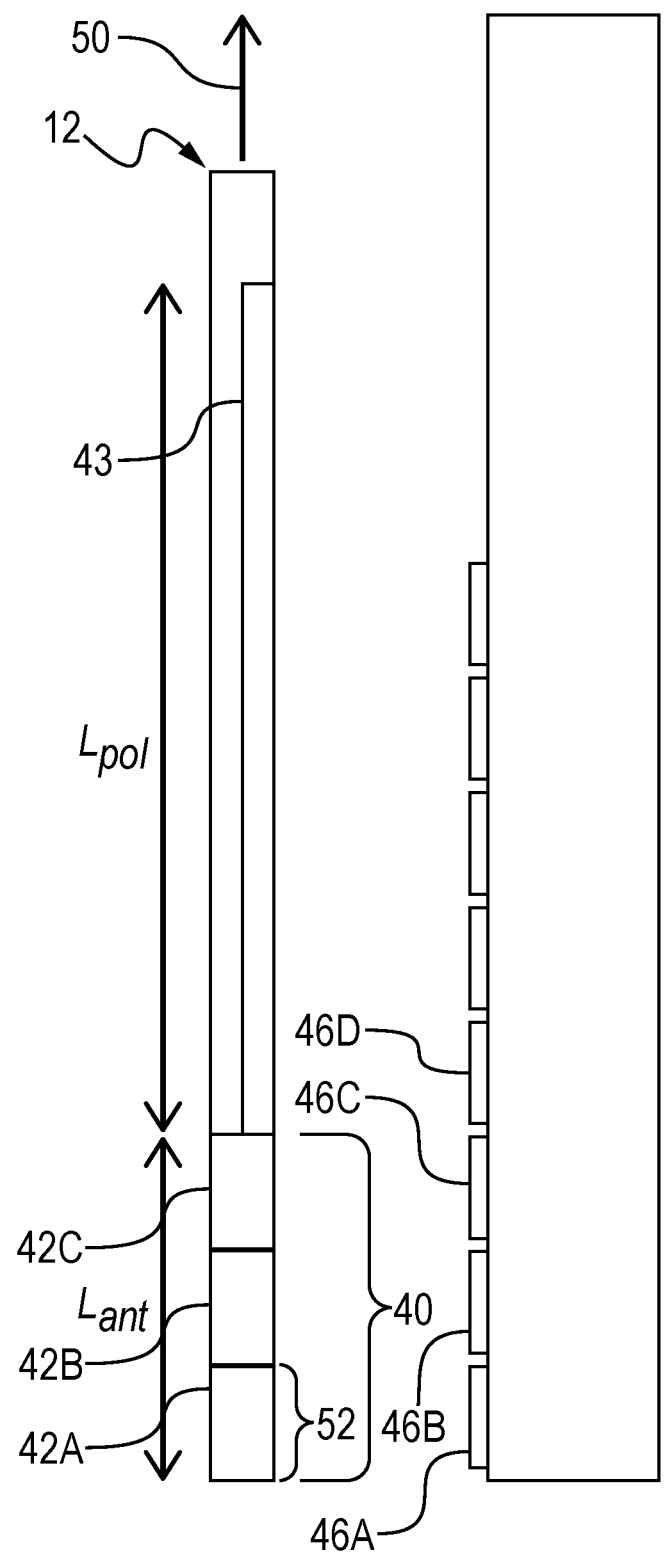
FIG. 9 is a schematic diagram of a downhole tool that includes antenna configured to generate NMR data, in accordance with an embodiment of the present disclosure.

FIG. 9 illustrates an example of a downhole tool 12 that includes an antenna (e.g., coils) array 40 that generally operate to generate NMR data indicative of a composition of a formation. As illustrated in FIG. 9, the antenna array 40 includes three antennae 42a, 42b, and 42c. In some embodiments, the antenna array 40 may include two or more than three antennae 42.

In general, each antenna 42 of the antenna array 40 transmits and receives NMR signals to and from a geological formation 14. In some embodiments, each antenna 42 of the antenna array 40 are independently controlled to both transmit and receive. That is, each antenna 42 may pulse independently and receive information (e.g., signals) independently. However, in some embodiments, each antenna 42 of the antenna array 40 are partially coupled. In accordance with one embodiment of the present disclosure, as a downhole tool 12 is moving along a geological formation 14, each antenna 42 will interact with a region 46 of the geological formation 14 that may be proportional (e.g., equal or approximately equal) to the length (e.g., along the direction of arrow 48) of each antenna 42. Put differently, each antenna 42 will at least partially overlap with a region 46 of the geological formation 14 and, thus, each antenna 42 will interact with a region 46 at a given time. For example, as illustrated, antenna 42a overlaps region 46a, antenna 42b overlaps region 46b, and antenna 42c overlaps region 46c. As such, antenna 42a is interacting with region 46a, antenna 42b is interacting with region 46b, and antenna 42c is interacting with region 46c. When the downhole tool 12 moves (e.g., along direction 50) a distance equal to the length 52 of an antenna 42, antenna 42c is interacting with region 46d, antenna 42b is interacting with region 46c, and antenna 42a is interacting with region 46b. It is presently recognized that optimization of the control of each antenna 42 of the antenna array 40 may reduce difficulties in downhole NMR acquisition such as pre-polarization the of the magnet(s) 43 on the NMR tool can be used to fullest effect, and fast logging by acquiring different patterns of NMR data on each coil to build up an entire suite of data all at one depth location.

Figure 10:
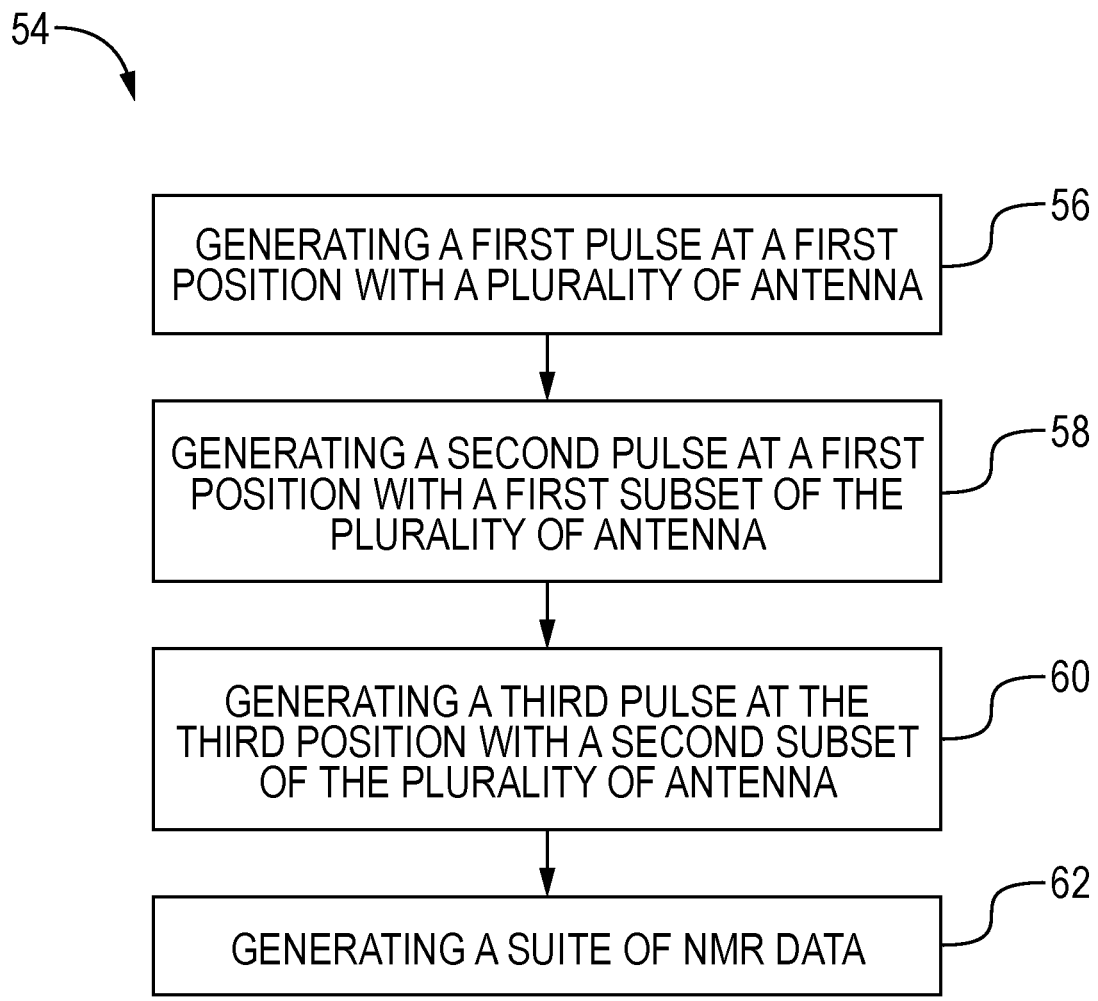
FIG. 10 is a flow diagram for generating a suite of NMR data, in accordance with an embodiment of the present disclosure.

FIG. 10 is a flow diagram 54 for generating NMR data, in accordance with aspects of the present disclosure. The steps illustrated in the flow diagram 54 may be performed via signals sent from the data processing system 28 or any suitable processing device. In general, the process uses one or more Carr-Purcell-Meiboom-Gill sequences and burst sequences to acquire a suite of NMR data. The phrase "CPMG" involves acquiring NMR echoes which give rise to T2-based information at a given wait time (polarization). The phrase "bursts" is used to refer to additional CPMG echo trains which are relatively shorter and repeated multiple times to build up signal to noise ratio for intermediate and shorter time constants, which also builds up the T1-based information in the data. In some embodiments, neither the bursts, nor the main CPMG echo trains are pure CPMGs. In some embodiments, the bursts or main CPMG echo trains comprise additional echo spacings, such as a diffusion editing method by two long echo spacings at the front of a CPMG, in order to encode diffusion into the NMR suite of data.

The flow diagram 54 may include generating a first pulse at a first position with a plurality of antennae (process block 56). In some embodiments, the first pulse may include a single CPMG sequence. After the first pulse is generated, a second pulse is generated with a first subset of the plurality of antennae (process block 58). The second pulse may include a CPMG and two "bursts", as discussed herein. It should be appreciated that this may be useful in generating T2 data. After the second pulse is generated, a third pulse is generated with a second subset of the plurality of antennae 42 (process block 60). For example, the second subset of the plurality of antennae 42 may be fewer than the first subset, or a subset of the first subset. In some embodiments, the third pulse may include a CPMG and five bursts. It should be appreciated that this may be useful in generating T1/T2 data. Furthermore, it should be appreciated that NMR data is gathered at each step, and the data at each step may be combined to produce a suite of NMR data (process block 62).

Figure 11:
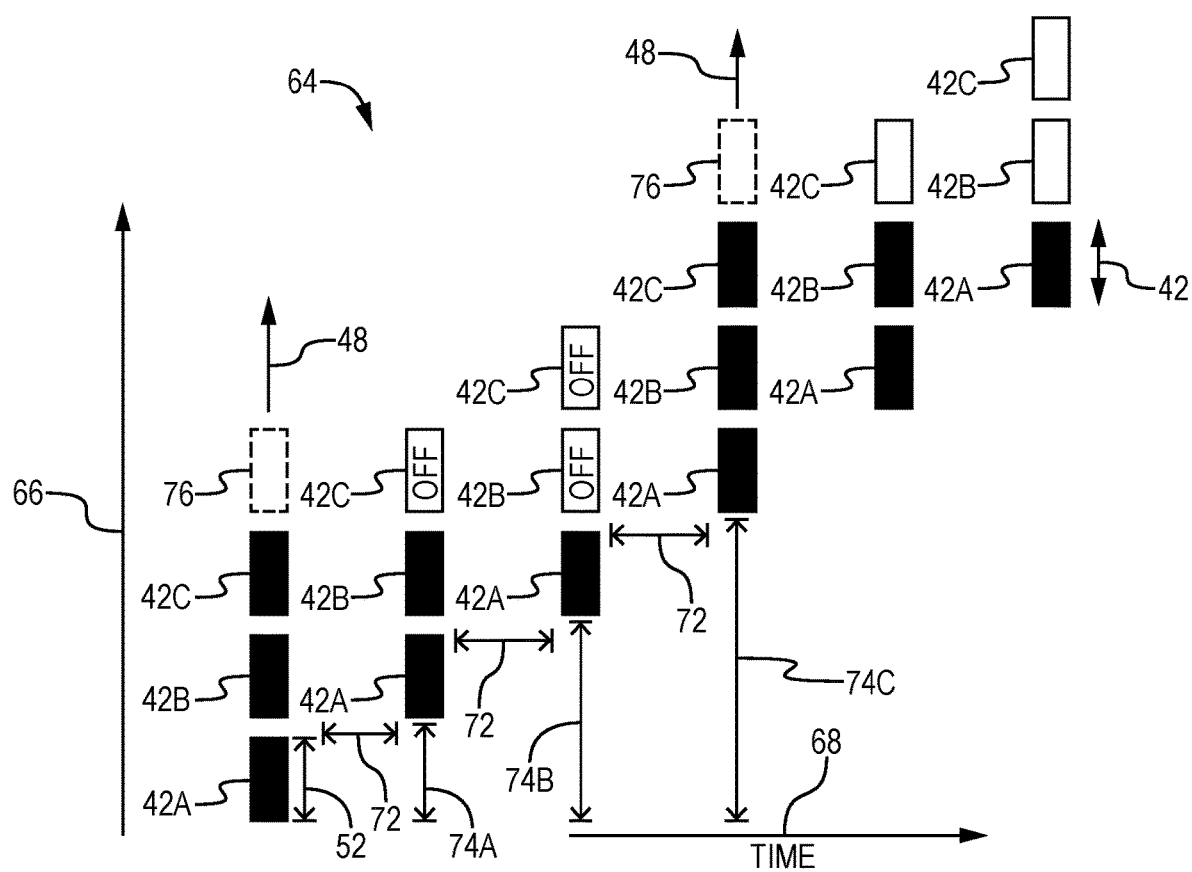
FIG. 11 is a block diagram illustrating an embodiment of the flow diagram shown in FIG. 10, in accordance with an embodiment of the present disclosure.

To further help illustrate the steps in the flow diagram 54 of FIG. 10, FIG. 11 is a block diagram 64 that illustrates an example of controlling the downhole tool 12 having the antenna array 40 shown in FIG. 9, in accordance with an embodiment of the present disclosure.

Generally, the block diagram 64 illustrates time points 70 that represent a position (e.g., along axis 66) of antennae 42 over time (e.g., axis 68) as the antennae move the direction of the arrow 48, which may be the direction of logging. The six time points 70*a*, 70*b*, 70*c*, 70*d*, 70*e*, and 70*f* each illustrate a respective position of the antennae 42 over a length of time. In some embodiments, the time difference 72 between each time point 70 are equal, while in other embodiments, the time difference 72 may vary by a mathematical relationship, such as an exponential relationship.

As a non-limiting example, each antenna 42 may be between 4 and 8 (e.g., 4, 5, 6, 7, 8) inches in length 52 and the logging speed (e.g., rate at which the downhole tool 12 is moving in the direction of the arrow 48) may be between 4 and 8 (e.g., 4, 5, 6, 7, 8) inches per second. In one example, when each antenna is 6 inches in length, and the downhole tool 12 is moving at 6 inches per second, the time difference 72 between each time point 70 is 1 second. The antennae 42 at time point 70*a* are at a first position. The antennae 42 at time point 70*b* have moved a distance 74*a* from the first position to a second position that is equal to one length 52 of the antenna 42. The antennae 42 at time point 70*c* have moved a distance 74*b* from the first position the third position that is equal to two lengths 52 of an antenna. In a similar manner, the distance 74*c* may be equal to three lengths 52.

At each time point 70, a different pattern of NMR data is acquired as described herein. An antenna 42 that is collecting data is indicated by a filled in box and produces a suit of data every 6 inches. For example, the antenna 42*c* of time point 70*b* is not transmitting and receiving data (e.g., OFF). At time point 70*a*, the antennae 42 may acquire NMR data in accordance with process block 56. At time point 70*b*, the antennae 42 may acquire NMR data in accordance with process block 58. As such, the first subset may be antennae 42*a* and 42*b*. At time point 70*c*, the antennae 42 may acquire NMR data in accordance with process block 60. As such, illustrated the second subset may be antenna 42*a*. The data acquired at each time point 70*a*, 70*b*, and 70*c* may be combined to generate a suite of NMR data. This process may then be repeated at time points 70*d*, 70*e*, and 70*f* to generate a second suite of NMR data.

The boxes 76 represent "hole-burned" or "used up hydrogen" regions. During operations, "hole-burned" regions may occur at the fourth positions 64*a* and 64*b*, where the hydrogens have already been pulsed and, thus, may provide little to no signal. It is presently recognized that one technique to overcome such difficulties is by placing a time gap during the process of generating the NMR data such that at least a portion of the data from the antenna array 40 are in "fresh", or non-previously pulsed hydrogen regions. Further, it is presently recognized that one or more additional antennae 42 may be disposed downstream (e.g., in the direction of the arrow 48) of the antennae 42, which may be configured to prepare the hydrogen spins and create signal to reduce or eliminate a T2 speed effect that may reduce the hydrogen signal as the downhole tool 12 moves along the borehole.

The specific embodiments described above have been shown by way of example, and it should be understood that these embodiments may be susceptible to various modifications and alternative forms. It should be further understood that the claims are not intended to be limited to the particular forms disclosed, but rather to cover modifications, equivalents, and alternatives falling within the spirit and scope of this disclosure.

The invention claimed is:

1. A method, comprising:
generating a first suite of pulses at a first position along a geological formation with a plurality of antennae, wherein the first suite of pulses comprises a Carr-Purcell-Meiboom-Gill (CPMG) sequence, and wherein each antenna of the plurality of antennae is configured to generate NMR data via transmitting and receiving pulses into the geological formation;
generating a second suite of pulses at a second position with a first subset of the antenna of the plurality of antennae, wherein the second suite of pulses comprises a CPMG and a first burst sequence wherein multiple shorter suites of pulses are repeated in succession;
generating a third or higher number of suites of pulses at a third or higher number position with a second or higher number of subsets of the plurality of antennae, wherein the first suite of pulses comprises a CPMG sequence and a second or higher number of burst sequences; and
generating a suite of NMR data based at least in part on the first suite of pulses, the second suite of pulses, and the third or higher number of suites of pulses.

2. The method of claim 1, wherein a logging direction can be into or out of the geological formation.

3. A method, comprising:
generating NMR data by transmitting and receiving pulses into the geological formation with a plurality of antennae on a downhole tool, wherein each antenna has a length L and wherein the downhole tool is moved at a rate substantially equal to L per second; and wherein at time points subsets of the plurality of antennae are active.

4. The method of claim 3, wherein a first subset of the plurality of the antennae comprises all of the antennae of the plurality of the antennae, two antennas of the plurality of antennae, or one antennae of the plurality of antennae.

5. The method of claim 4, wherein a second subset of the plurality of the antennae comprises all of the antennae of the plurality of the antennae.

6. The method of claim 3, wherein a first subset of the plurality of the antennae comprises two antennae of the plurality of antennae.

7. The method of claim 6, wherein a second subset of the plurality of the antennae comprises one antennae of the plurality of antennae.

8. The method of claim 7, wherein a third subset of the plurality of the antennae comprises all of the antennae of the plurality of antennae.

9. A method, comprising:
generating NMR data by transmitting and receiving pulses into the geological formation with at least one antennae on a downhole tool, wherein the at least one antenna is segmented into a at least one transmitter section and at least one receiver section; wherein the at least one transmitter section is active during transmit mode, and the at least one receiver section is active during receive mode; wherein the upper the at least one transmitter section portion is electrically shorted during the receive mode;
generating a first suite of pulses at a first position along a geological formation with the at least one transmitter section and the at least one receiver section, wherein the first suite of pulses comprises a Carr-Purcell-Meiboom-Gill (CPMG) sequence, and wherein the at least one transmitter section and at least one receiver section are configured to generate NMR data via transmitting and receiving pulses into the geological formation;

generating a second suite of pulses at a second position with the at least one transmitter section and the at least one receiver section, wherein the second suite of pulses comprises a CPMG and a first burst sequence wherein multiple shorter suites of pulses are repeated in succession; and generating at least another suite of pulses at at least a third position with the at least one transmitter section and receiver section, wherein the at least another suite of pulses comprises a CPMG sequence and a second or higher number of burst sequences; and generating a suite of NMR data based at least in part on the first suite of pulses, the second suite of pulses, and the at least another suite of pulses.

10. The method of claim 9, wherein the at least one transmitter section is a plurality of transmitter sections, and wherein the at least one receiver section is a plurality of receiver sections.

11. The method of claim 9, wherein the at least one of the transmitter sections of the plurality of transmitter sections are electrically shorted using a mechanical switch.

12. The method of claim 10, wherein the at least one of the transmitter sections of the plurality of transmitter sections are electrically shorted using a solid state switch.

13. The method of claim 10, wherein the first suite of pulses is generated using a first subset of receiver sections of the plurality of receiver sections and a first subset of transmitter sections of the plurality of transmitter sections.

14. The method of claim 13, wherein the second suite of pulses is generated using a second subset of receiver sections of the plurality of receiver sections and a second subset of transmitter sections of the plurality of transmitter sections.

15. The method of claim 14, wherein the additional suite of pulses is generated using an additional subset of receiver sections of the plurality of receiver sections and an additional subset of transmitter sections of the plurality of transmitter sections.

16. The method of claim 9, wherein a logging direction can be into or out of the geological formation.

* * * * *